United States Patent
Yokokawa

(10) Patent No.: US 10,763,157 B2
(45) Date of Patent: Sep. 1, 2020

(54) METHOD FOR MANUFACTURING SOI WAFER

(71) Applicant: SHIN-ETSU HANDOTAI CO., LTD., Tokyo (JP)

(72) Inventor: Isao Yokokawa, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/465,879

(22) PCT Filed: Nov. 27, 2017

(86) PCT No.: PCT/JP2017/042334
§ 371 (c)(1),
(2) Date: May 31, 2019

(87) PCT Pub. No.: WO2018/116746
PCT Pub. Date: Jun. 28, 2018

(65) Prior Publication Data
US 2019/0295883 A1 Sep. 26, 2019

(30) Foreign Application Priority Data
Dec. 19, 2016 (JP) .................. 2016-245620

(51) Int. Cl.
*H01L 21/02* (2006.01)
*H01L 21/762* (2006.01)
*H01L 27/12* (2006.01)

(52) U.S. Cl.
CPC ........ *H01L 21/76251* (2013.01); *H01L 21/02* (2013.01); *H01L 21/02052* (2013.01); *H01L 27/12* (2013.01)

(58) Field of Classification Search
None
See application file for complete search history.

(56) References Cited

U.S. PATENT DOCUMENTS

| 6,156,624 A | 12/2000 | Yamagata et al. |
| 2004/0035525 A1 | 2/2004 | Yokokawa et al. |

(Continued)

FOREIGN PATENT DOCUMENTS

| JP | H09-331049 A | 12/1997 |
| JP | 2002-313689 A | 10/2002 |

(Continued)

OTHER PUBLICATIONS

Jun. 25, 2019 International Preliminary Report on Patentability issued in International Patent Application PCT/JP2017/042334.

(Continued)

*Primary Examiner* — Bradley Smith
(74) *Attorney, Agent, or Firm* — Oliff PLC

(57) ABSTRACT

A method for manufacturing an SOI wafer, including steps of: bonding a bond wafer and a base wafer each composed of a silicon wafer at room temperature with a silicon oxide film interposed therebetween; a thinning the bond wafer; and before the bonding step, cleaning the wafers with a hydrophilic cleaning liquid and drying the cleaned wafers by suction drying or spin drying. After the drying step is ended and before the bonding step is started, the wafers are stored until a state where a bonding speed at which the bonding step is to be performed is 20 mm/second or less. The bonding is performed with the bonding speed of 20 mm/second or less. This provides a method for manufacturing an SOI wafer by which an SOI wafer can be manufactured while generation of outer-peripheral micro voids is suppressed in a simple manner.

10 Claims, 2 Drawing Sheets

(56) References Cited

U.S. PATENT DOCUMENTS

| | | | |
|---|---|---|---|
| 2006/0073644 A1* | 4/2006 | Atoji | H01L 21/02052 438/147 |
| 2007/0119812 A1* | 5/2007 | Kerdiles | H01L 21/2007 216/34 |
| 2011/0104871 A1 | 5/2011 | Tobisaka et al. | |

FOREIGN PATENT DOCUMENTS

| | | |
|---|---|---|
| JP | 2006-80314 A | 3/2006 |
| JP | 2007-194347 A | 8/2007 |
| JP | 2007-194349 A | 8/2007 |
| JP | 2009-272619 A | 11/2009 |
| JP | 2012-238873 A | 12/2012 |
| JP | 2013-55184 A | 3/2013 |

OTHER PUBLICATIONS

Feb. 20, 2018 International Search Report issued in International Patent Application PCT/JP2017/042334.

\* cited by examiner

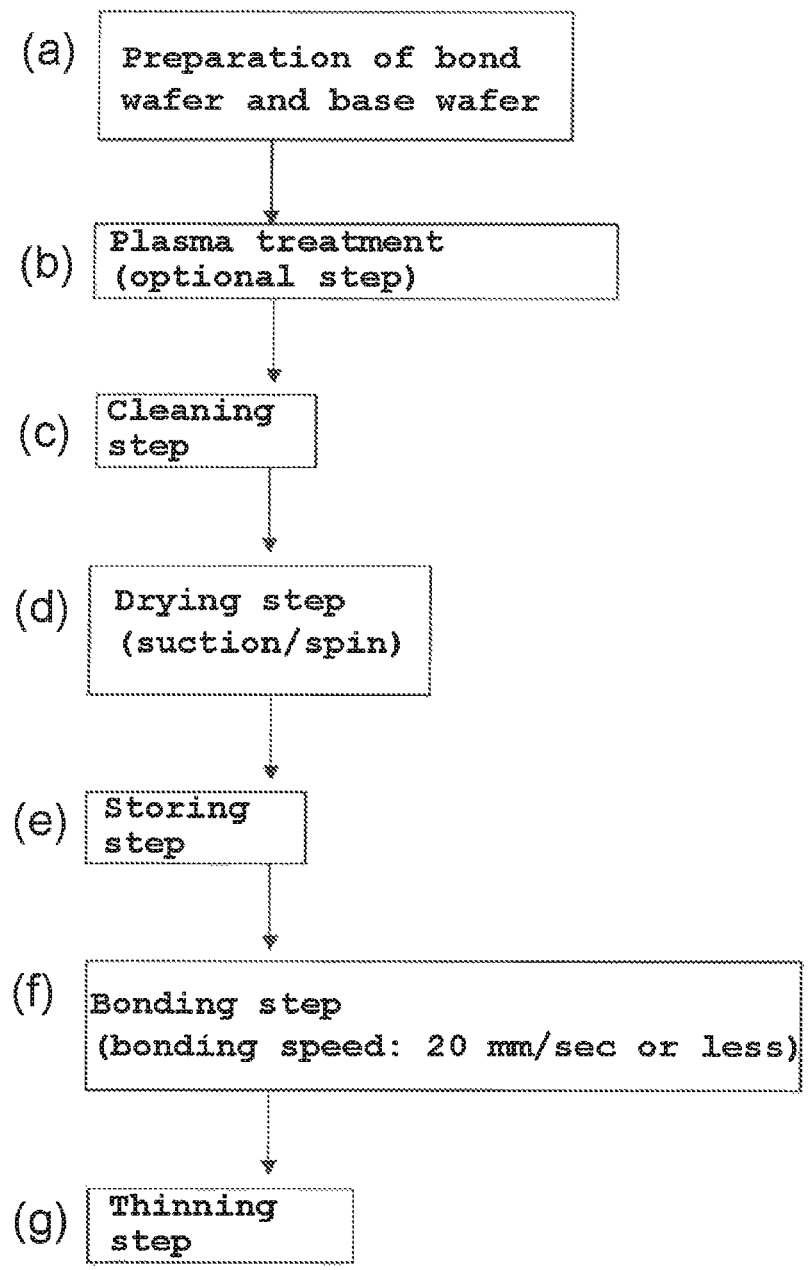

[FIG. 2]
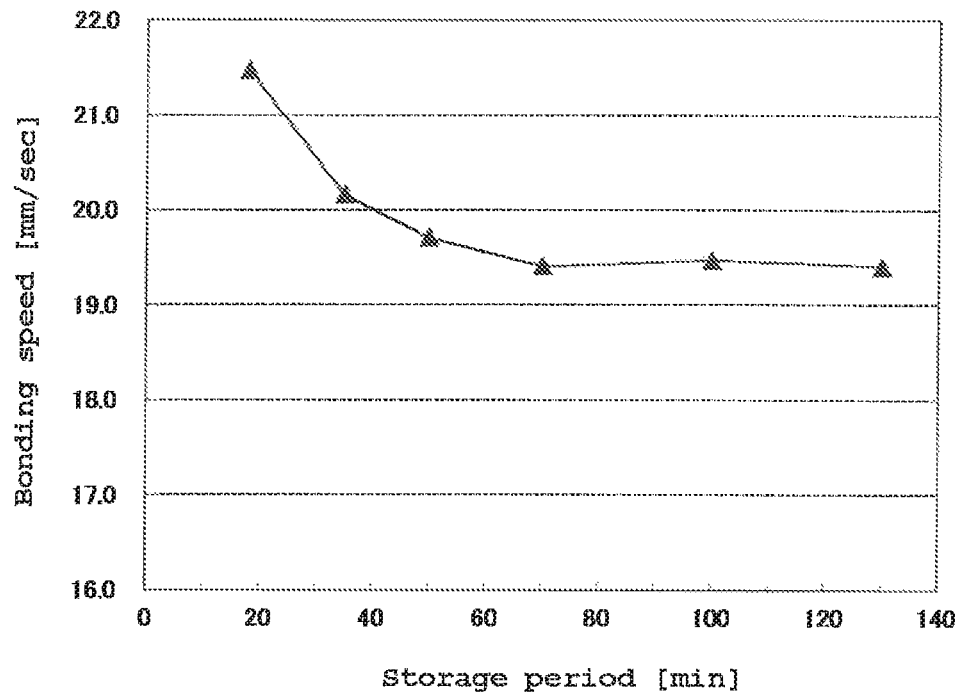
[FIG. 3]
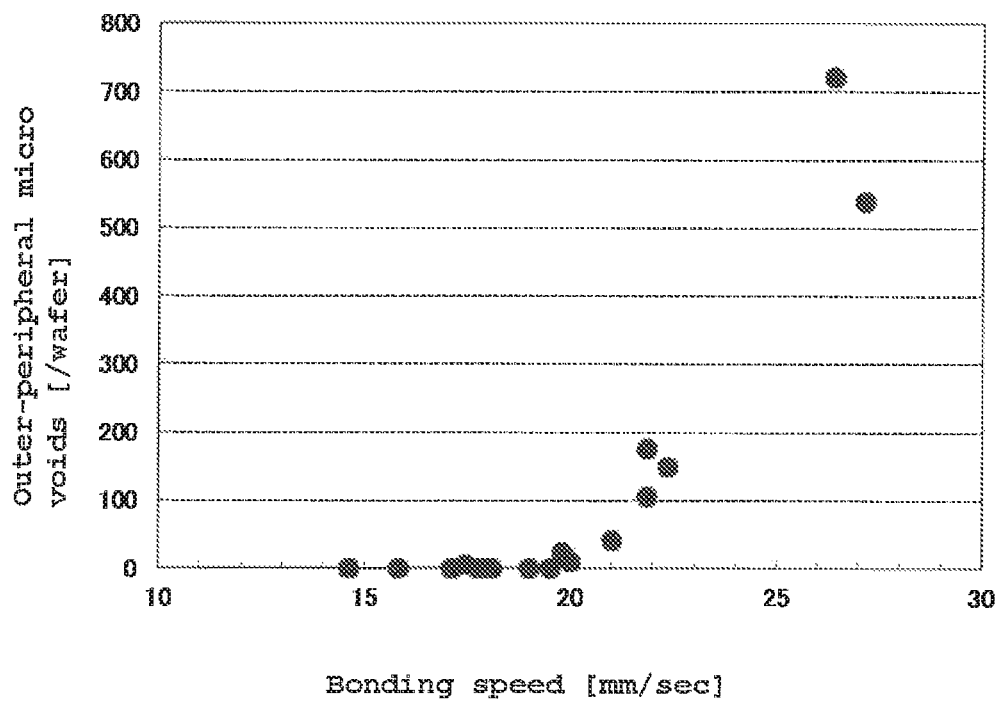

METHOD FOR MANUFACTURING SOI WAFER

TECHNICAL FIELD

The present invention relates to a method for manufacturing an SOI wafer, and particularly relates to a method for manufacturing an SOI wafer by bonding two wafers.

BACKGROUND ART

When two silicon wafers are bonded at room temperature, the bonding progresses from one side of an outer peripheral edge of each wafer toward the opposite side of the outer peripheral edge. Finally, air may be enclosed by the bonding and remain, causing micro-size voids at the outer peripheral portion (hereinafter, referred to as outer-peripheral micro voids) in some cases.

An outer-peripheral micro void is formed in a region 3 to 5 mm from an edge of an outer peripheral portion of a wafer and has such a size that the diameter is about 0.1 to 1 mm. There is a trend that increasing the bonding speed during the bonding increases the outer-peripheral micro voids.

When two wafers stacked on each other are partially pressed, the bonding of the wafers extends over the entire interface owing to attraction force that acts between the surfaces with low roughness and high precision. Thus, the bonding speed can be measured by observing the advancement of the bonding wave with an infrared camera or the like.

To increase the bonding strength in bonding wafers, the surface(s) to be bonded is/are subjected to a plasma treatment (in which the surface(s) to be bonded is/are exposed to plasma and activated). Thereby, the bonding speed is increased, so that outer-peripheral micro voids are likely to be generated.

Patent Document 1 states in paragraph [0061] that "edge voids", which are voids appearing at an outer peripheral portion of a bonded wafer, can be suppressed when the bonding speed is less than 1.7 cm/s. Moreover, Patent Document 2 states in [0005] and [0006] that setting a contact wave speed of 50 mm/second or less can suppress micro voids at an outer peripheral portion of a wafer. Patent Document 1 states that heating decreases the thickness of a water layer adsorbed at the wafer surface. Patent Document 2 states that the bonding progression speed is controlled by controlling the pressure, type, and viscosity of an atmosphere in a bonding environment. However, it cannot be said these are simple methods.

CITATION LIST

Patent Literature

Patent Document 1: Japanese Unexamined Patent Application Publication No. 2012-238873
Patent Document 2: Japanese Unexamined Patent Application Publication No. 2007-194347

SUMMARY OF INVENTION

Technical Problem

In view of the problems described above, an object of the present invention is to provide a method for manufacturing an SOI wafer by which an SOI wafer can be manufactured while generation of outer-peripheral micro voids is suppressed in a simple manner.

Solution to Problem

To achieve the object, the present invention provides a method for manufacturing an SOI wafer, including:
a bonding step of bonding a bond wafer composed of a silicon wafer and a base wafer composed of a silicon wafer at room temperature with a silicon oxide film interposed therebetween, the silicon oxide film being formed on a surface of at least one of the bond wafer and the base wafer; and
a thinning step of thinning the bond wafer after the bonding step to manufacture an SOI wafer, wherein
the method further comprises, before the bonding step:
a cleaning step of cleaning the bond wafer and the base wafer with a hydrophilic cleaning liquid; and
a drying step of drying the cleaned bond wafer and base wafer by at least any one drying method of suction drying and spin drying,
after the drying step is ended and before the bonding step is started, the bond wafer and the base wafer are stored until a state where a bonding speed at which the bonding step is to be performed is 20 mm/second or less, and
the bonding is performed with the bonding speed of 20 mm/second or less.

When an SOI wafer is manufactured by a bonding method, a method like above can manufacture an SOI wafer while suppressing generation of outer-peripheral micro voids in a simple manner of only adjusting the storage period after the drying step is ended and before the bonding step is started. Hence, facility investments such as introduction of new facility or remodeling of conventional facility are not required, so that the method is economical.

In this event, the storing is preferably performed for a period of 70 minutes or more.

Setting such a storage period makes it easier to control the bonding speed in the bonding at 20 mm/second or less. As a result, an SOI wafer can be manufactured while the generation of outer-peripheral micro voids is more surely suppressed.

Moreover, it is possible to comprise a step of performing a plasma treatment on at least one of the bond wafer and the base wafer before the cleaning step.

Performing the plasma treatment before the cleaning step as described above makes it possible to increase the bonding strength between the wafers during the bonding. Moreover, performing the plasma treatment tends to increase the bonding speed during the bonding in comparison with a case of not performing the plasma treatment, so that outer-peripheral micro voids are likely to be generated. Nevertheless, as in the present invention, the bonding speed is decreased by adjusting the storage period after the drying step, thereby making it possible to suppress the generation of outer-peripheral micro voids. In other words, the present invention is particularly effective when a plasma treatment is performed which would otherwise facilitate the generation of outer-peripheral micro voids.

Additionally, the hydrophilic cleaning liquid is preferably an SC1 solution or an SC2 solution.

An SC1 solution or an SC2 solution can be suitably used as the hydrophilic cleaning liquid which is employed to clean wafers before the bonding.

Moreover, the storing is preferably performed for a period of 5 hours or less.

Thereby, a decrease in productivity can be suppressed.

Further, during the storage, the bond wafer and the base wafer are preferably stored to be in contact with an atmosphere having a temperature of 25±5° C. and a humidity of 40±20%.

Such an atmosphere is substantially the same as an atmosphere in a normal clean room. By storing the wafers in contact with such an atmosphere, the water content on the wafer surfaces can be decreased within an appropriate range.

Further, in the inventive method for manufacturing an SOI wafer, after the bonding step and before a first heat treatment is performed, the bond wafer and the base wafer are preferably left alone for 24 hours or more while being bonded to each other.

This enables a further reduction of outer-peripheral micro voids in the SOI wafer after the bonding.

Advantageous Effects of Invention

When an SOI wafer is manufactured by a bonding method, the inventive method for manufacturing an SOI wafer makes it possible to manufacture an SOI wafer while suppressing generation of outer-peripheral micro voids in a simple manner of only adjusting the storage period after the drying step is ended and before the bonding step is started. This makes facility investments unnecessary, such as introduction of new facility or remodeling of conventional facility. Thus, the method is economical.

BRIEF DESCRIPTION OF DRAWINGS

FIG. 1 is a flowchart showing an outline of steps of the present invention;

FIG. 2 is a graph showing a relation between the storage period after drying and the bonding speed obtained in Experimental Example; and FIG. 3 is a graph showing a relation between the bonding speed and the number of outer-peripheral micro voids per wafer obtained in Experimental Example.

DESCRIPTION OF EMBODIMENTS

Hereinafter, the present invention will be described in detail with reference to the drawings as an example of embodiments. However, the present invention is not limited thereto.

A method for manufacturing an SOI wafer of the present invention includes a bonding step of bonding a bond wafer composed of a silicon wafer and a base wafer composed of a silicon wafer at room temperature with a silicon oxide film interposed therebetween, the silicon oxide film being formed on a surface of at least one of the bond wafer and the base wafer. Moreover, the inventive method includes a thinning step of thinning the bond wafer after the bonding step. In the present invention, the method further includes before the bonding step: a cleaning step of cleaning the bond wafer and the base wafer with a hydrophilic cleaning liquid; and a drying step of drying the cleaned bond wafer and base wafer by at least any one drying method of suction drying and spin drying. In the present invention, after the drying step is ended and before the bonding step is started, the bond wafer and the base wafer are stored until a state where a bonding speed at which the bonding step is to be performed is 20 mm/second or less. After the storage as described above, the bonding is performed with the bonding speed of 20 mm/second or less.

The suction drying method and the spin drying method resemble natural drying. Hence, even after the drying step is ended, the water content on the silicon wafer surfaces is high. In manufacturing an SOI wafer, when the wafers are bonded at room temperature, the bonding proceeds by utilizing hydrogen bonds of water. When the water content on the wafer surfaces is high, the bonding speed is increased. Nonetheless, after the drying is ended, if the wafers are stored for a while without modifying the surface states, the water content on the wafer surfaces is decreased to an amount that corresponds to the humidity of the environment. Thus, the bonding speed is decreased, and the number of outer-peripheral micro voids generated can be decreased or can be zero.

As described above, decreasing the bonding speed per se has been known to suppress outer-peripheral micro voids (Patent Documents 1, 2). Nevertheless, the specific methods mentioned above include: heating to decrease the thickness of a water layer adsorbed on the surfaces as described in Patent Document 1; and controlling the bonding environment (atmosphere, air pressure, and so forth) as in Patent Document 2. However, controlling the elapsed time (storage period) after cleaning and drying and before bonding as in the present invention is not disclosed.

Hereinafter, the inventive method for manufacturing an SOI wafer will be described in more details with reference to FIG. 1. FIG. 1 is a flowchart showing an outline of steps (a to g) in the present invention.

First, a bond wafer composed of a silicon wafer and a base wafer composed of a silicon wafer are prepared (step a). In this event, at least one of the bond wafer and the base wafer is prepared to have a silicon oxide film formed on a surface thereof. The silicon oxide film on the surface is preferably a thermal oxide film.

Before the bond wafer and base wafer prepared as described above are cleaned (step c), a plasma treatment is preferably performed on at least one of the bond wafer and the base wafer (step b). This step is not essential. This plasma treatment is a treatment to expose the wafer(s) to plasma and thereby activate the surface(s) to be bonded. The plasma treatment can increase the bonding strength of the bonded wafer after the wafers are bonded. Nevertheless, this plasma treatment tends to increase the bonding speed during the bonding in comparison with a case of not performing the plasma treatment, so that outer-peripheral micro voids are likely to be generated. However, controlling the storage period in step e, which will be described later, adjusts the storage period after the drying step, and thereby can decrease the bonding speed. Thus, the generation of outer-peripheral micro voids can be suppressed.

Next, the bond wafer and the base wafer are cleaned with a hydrophilic cleaning liquid (step c). This cleaning is preferably performed with an SC1 solution or an SC2 solution. The SC1 solution is an aqueous solution containing ammonia and hydrogen peroxide, and the SC2 solution is an aqueous solution containing hydrogen chloride and hydrogen peroxide. Both of the solutions to be used may have compositions normally employed for cleaning silicon wafers. Additionally, regarding the other cleaning conditions also, conditions normally employed for cleaning silicon wafers are applicable.

Next, the cleaned bond wafer and base wafer are dried by at least any one drying method of suction drying and spin drying (step d). Regarding the suction drying or the spin drying, reference can be made to Japanese Unexamined Patent Application Publication No. 2002-313689, for example. The suction drying is a drying method by which the water content on the wafer surface is sucked and removed. In the suction drying, for example, a silicon wafer is substantially perpendicularly put on a drying stage in which a vacuum suction line is installed, and the water content is sucked from a lower portion of the wafer, so that the water content on the wafer surface can be removed. By putting multiple substrates on the drying stage, the multiple substrates can be dried simultaneously, and high productivity can be achieved. The spin drying removes the water content on a silicon wafer by utilizing a centrifugal force obtained by rotating the wafer at high speed, and can be conducted with a normal spin dryer. Note that the drying method used in the present invention does not include IPA drying (water displacing method), which is one of typical examples of drying methods.

Next, after the drying step (step d) is ended and before the bonding step (step f) is started, the present invention includes the storing step (step e). In this storing step, the bond wafer and the base wafer are stored until a state where a bonding speed at which the bonding step is to be performed is 20 mm/second or less. How long the storage should be continued under certain conditions until the state where the bonding speed becomes 20 mm/second or less can be easily determined by an experiment. Moreover, the bonding speed can be measured by observation with an infrared camera or the like. Both of the suction drying and the spin drying enable the water content adjustment during the bonding by leaving the water content on the wafer surfaces. Nevertheless, if the bonding is performed immediately after the suction drying or the spin drying as described above in conventional techniques, the bonding speed is so high that outer-peripheral micro voids cannot be suppressed.

The length of the storage period in the storing step is not particularly limited, as long as the bonding speed in the bonding can be 20 mm/second or less. The storage period is preferably 50 minutes or more, particularly preferably 70 minutes or more. During the storage, the bond wafer and the base wafer are preferably stored to be in contact with an atmosphere having a temperature of 25±5° C. and a humidity of 40±20%. Such an atmosphere is substantially the same as an atmosphere in a normal clean room. Storing the wafers in contact with such an atmosphere can reduce the water content on the wafer surfaces to be within an appropriate range. In consideration of the productivity, the storing is preferably performed for a period of 5 hours or less.

In a case of batch drying in which multiple wafers housed in a wafer carrier are dried at once as in the suction drying, the wafers themselves can be stored in a drying apparatus. Alternatively, the wafers can be transferred together with the wafer carrier to a clean bench in a clean room and stored therein, or can also be transferred to and stored in another storage container.

Next, the bond wafer and the base wafer are bonded at room temperature with the silicon oxide film interposed therebetween, the silicon oxide film being formed on the surface of at least one of the bond wafer and the base wafer (step f). In this event, since the storing step has been performed in the present invention, the bonding speed is 20 mm/second or less, and the generation of outer-peripheral micro voids is suppressed.

After the bonding step (step f), the thinning step is performed to thin the bond wafer (step g). Thus, an SOI wafer is manufactured. This thinning may be performed by ion implantation delamination or by a process such as grinding, polishing, and etching. When the thinning is performed by the ion implantation delamination, an ion implanted layer with hydrogen ions or the like is formed in the bond wafer in advance at least before the cleaning step (step c). After the bonding, a heat treatment (delamination heat treatment) may be performed for delamination at the ion implanted layer, so that the bond wafer can be thinned. In the ion implantation delamination method, the delamination heat treatment may be followed by a bonding heat treatment, or a bonding heat treatment which also serves as the delamination heat treatment may be performed. Thus, the bonding strength of the bonded wafer can be increased. When the thinning is performed by grinding, polishing, etching, or the like, the bonding heat treatment is preferably performed before the grinding or the like to thus increase the bonding strength of the bonded wafer.

Although an SOI wafer is manufactured as described above, a step other than the above may be performed. For example, the present invention may include a post-bonding storing step, the post-bonding storing being performed for 24 hours or more after the bonding and before a first heat treatment, as follows.

(Storage of Wafers after Bonding)

The study by the inventor has revealed that outer-peripheral micro voids generated in wafers bonded at room temperature disappear when the wafers are left alone under unchanged conditions for one day to several days. The reason is not exactly clear, but is probably that bubbles are expelled outside the wafers.

Thus, when outer-peripheral micro voids are not generated at all immediately after the bonding at room temperature is completed, a heat treatment may be performed (in the case of the ion implantation delamination method, delamination heat treatment; in the case of the thinning by grinding or polishing, bonding heat treatment) without any other process. Meanwhile, when outer-peripheral micro voids are generated to some extent, after the bonding step and before a first heat treatment is performed, the bond wafer and the base wafer are preferably left alone at room temperature for a long time (24 hours or more) while being bonded to each other, followed by the heat treatment. Nevertheless, in consideration of the productivity, the wafers do not necessarily have to be left alone (for one day to several days) after the bonding. In addition, the time during which the wafers are left alone may be shorter (for example, 6 hours or more).

Experimental Example

In manufacturing an SOI wafer by bonding, a relation between the bonding speed and the storage period (elapsed time) after the drying step was ended was examined as follows. Moreover, a relation between the bonding speed and the generation of outer-peripheral micro voids was examined.

As a bond wafer, a silicon single crystal wafer was prepared which had a diameter of 300 mm and a main surface with a crystal orientation of <100>. In addition, a thermal oxide film having a thickness of 190 nm was formed. Hydrogen ions were implanted into this bond wafer for delamination, and a hydrogen ion-implanted layer was formed therein.

As a base wafer, a silicon single crystal wafer was prepared which had a diameter of 300 mm and a main surface with a crystal orientation of <100>. No thermal oxide film was formed on this base wafer. No hydrogen ion-implanted layer was formed, either.

Next, both of the bond wafer and the base wafer were subjected to a plasma treatment. The plasma treatment was performed with an oxygen plasma.

Next, cleaning was performed before the bonding. Specifically, both the plasma-treated wafers were subjected to SC1 cleaning. After the cleaning was ended, the two wafers were subjected to suction drying.

Next, the wafers were stored until the bonding. The storing was performed in a wafer container FOUP (Front-Opening Unified Pod) for the storage. The storage environment was at a temperature of 22° C. and a humidity of 40%. This was an atmosphere equivalent to an atmosphere in a clean room. The storage period in this storing step was changed in a range from 18 minutes to 130 minutes.

After the storage under the aforementioned conditions, the bonding was performed at room temperature. After the bonding, a delamination heat treatment was performed under conditions of 500° C. and 30 minutes, followed by delamination at the hydrogen ion-implanted layer.

After the delamination was completed, void observation was carried out. Specifically, after the delamination was ended, the bonded wafer was visually observed under a fluorescent lamp or a light-condensing lamp.

FIG. 2 shows the relation between the bonding speed and the storage period after the drying step was ended. FIG. 2 revealed that when the storage period exceeded about 50 minutes, the bonding speed was decreased to less than 20 mm/second; when the storage period was 70 minutes or more, the bonding speed substantially reached a plateau at about 19.5 mm/second.

Before the bonding, the SC-1 cleaning conditions (chemical solution temperature, chemical solution concentration, cleaning time) were adjusted to change the surface roughness after the cleaning, and thereby change the bonding speed. FIG. 3 shows the result of examining the relation between the bonding speed and the number of outer-peripheral micro voids generated per wafer. It was revealed that when the bonding speed was about 20 mm/second or less, outer-peripheral micro voids were hardly generated. Note that each bonding speed was obtained as follows. Specifically, a bonding wave was observed with an infrared camera, and a time during which the bonding wave progressed from an edge on one side of a wafer to an edge on the opposite side was measured. Based on the time and the wafer diameter, the bonding speed was calculated.

EXAMPLE

Hereinafter, the present invention will be described more specifically with reference to Examples and Comparative Example. However, the present invention is not limited to these Examples.

Example 1

One batch (25 wafers) of bonded SOI wafers was manufactured under the same conditions as in Experimental Example, except that the elapsed time (storage period) was 70 minutes after the drying step was ended and before the bonding at room temperature was performed. In this event, since the 25 wafers were successively bonded, the storage period of the first wafer was 70 minutes, but the storage period of the 25th wafer was 120 minutes. In other words, the storage period varied in a range from 70 minutes to 120 minutes. In this case, the bonding speed ranged from 19.0 to 19.5 mm/second. As a result, the outer-peripheral micro voids were 0.8/wafer on average.

Example 2

One batch (25 wafers) of bonded SOI wafers was manufactured under the same conditions as in Experimental Example, except that the storage period was 50 minutes after the drying step was ended and before the bonding at room temperature was performed. In this event, the 25 wafers were successively bonded as in Example 1. Thus, the storage period of the first wafer was 50 minutes, but the elapsed time of the 25th wafer was 100 minutes. In other words, the storage period varied in a range from 50 minutes to 100 minutes. In this case, the bonding speed ranged from 19.5 to 20.0 mm/second. As a result, the outer-peripheral micro voids were 4.8/wafer on average.

Example 3

One batch (25 wafers) of bonded SOI wafers was manufactured under the same conditions as in Example 1, except that the wafers immediately after the bonding at room temperature were left alone as they were for one day (24 hours) at room temperature, followed by the delamination heat treatment. As a result, the outer-peripheral micro voids were 0.08/wafer on average.

Example 4

One batch (25 wafers) of bonded SOI wafers was manufactured under the same conditions as in Example 2, except that the wafers immediately after the bonding at room temperature were left alone as they were for 4 days at room temperature, followed by the delamination heat treatment. As a result, the outer-peripheral micro voids were 0.2/wafer on average.

Comparative Example 1

Five bonded SOI wafers were manufactured under the same conditions as in Experimental Example, except that the elapsed time (storage period) was not adjusted after the drying step was ended and before the bonding at room temperature was performed. The time after the drying step was ended and before the bonding at room temperature was performed was 5 minutes or less. In this case, the bonding speed ranged from 22 to 25 mm/second. As a result, the outer-peripheral micro voids were 310/wafer on average.

The results of Examples 1 to 4 revealed that when the bonding speed during the bonding was set at 20 mm/second or less by adjusting the time after the drying step was ended and before the bonding at room temperature was performed, the generation of outer-peripheral micro voids was successfully suppressed. Moreover, the results of Examples 3, 4 revealed that when the bonded wafer was stored for 24 hours or more before the first heat treatment, the generation of outer-peripheral micro voids was further successfully suppressed.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A method for manufacturing an SOI wafer, the method comprising:
 a bonding step of bonding a bond wafer composed of a silicon wafer and a base wafer composed of a silicon wafer at room temperature with a silicon oxide film interposed therebetween, the silicon oxide film being formed on a surface of at least one of the bond wafer and the base wafer; and a thinning step of thinning the bond wafer after the bonding step to manufacture an SOI wafer, wherein the method further comprises, before the bonding step:

a cleaning step of cleaning the bond wafer and the base wafer with a hydrophilic cleaning liquid; and a drying step of drying the cleaned bond wafer and base wafer by at least any one drying method of suction drying and spin drying, after the drying step is ended and before the bonding step is started, the bond wafer and the base wafer are stored for a period of 50 minutes or more and 5 hours or less until a state where a bonding speed at which the bonding step is to be performed is 20 mm/second or less, and the bonding is performed with the bonding speed of 14 mm/second or more and 20 mm/second or less.

2. The method for manufacturing an SOI wafer according to claim 1, wherein the storing is performed for a period of 70 minutes or more and 5 hours or less.

3. The method for manufacturing an SOI wafer according to claim 2, comprising a step of performing a plasma treatment on at least one of the bond wafer and the base wafer before the cleaning step.

4. The method for manufacturing an SOI wafer according to claim 3, wherein the hydrophilic cleaning liquid is an SC1 solution or an SC2 solution.

5. The method for manufacturing an SOI wafer according to claim 2, wherein the hydrophilic cleaning liquid is an SC1 solution or an SC2 solution.

6. The method for manufacturing an SOI wafer according to claim 1, comprising a step of performing a plasma treatment on at least one of the bond wafer and the base wafer before the cleaning step.

7. The method for manufacturing an SOI wafer according to claim 6, wherein the hydrophilic cleaning liquid is an SC1 solution or an SC2 solution.

8. The method for manufacturing an SOI wafer according to claim 1, wherein the hydrophilic cleaning liquid is an SC1 solution or an SC2 solution.

9. The method for manufacturing an SOI wafer according to claim 1, wherein during the storage, the bond wafer and the base wafer are stored to be in contact with an atmosphere having a temperature of $25\pm5°$ C. and a humidity of $40\pm20\%$.

10. The method for manufacturing an SOI wafer according to claim 1, wherein after the bonding step and before a first heat treatment is performed, the bond wafer and the base wafer are left alone for 24 hours or more while being bonded to each other.

* * * * *